(12) United States Patent
Smith et al.

(10) Patent No.: US 6,617,199 B2
(45) Date of Patent: Sep. 9, 2003

(54) ELECTRONIC DEVICE HAVING FIBROUS INTERFACE

(75) Inventors: Charles Smith, Escondido, CA (US); Michael M. Chau, San Diego, CA (US); Roger A. Emigh, Post Falls, ID (US); Nancy F. Dean, Liberty Lake, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/735,305

(22) Filed: Jan. 31, 2001

(65) Prior Publication Data

US 2001/0023968 A1 Sep. 27, 2001

Related U.S. Application Data

(63) Continuation of application No. 09/103,415, filed on Jun. 24, 1998, now abandoned.

(51) Int. Cl.[7] ................................................. H01L 21/44
(52) U.S. Cl. ..................... 438/122; 438/106; 438/118; 438/121; 438/123; 438/124
(58) Field of Search ................. 438/106, 118, 438/121, 122, 123, 124

(56) References Cited

U.S. PATENT DOCUMENTS

| | | |
|---|---|---|
| 3,972,821 A | 8/1976 | Weidenbenner et al. |
| 3,973,059 A | 8/1976 | Brown et al. ............... 428/180 |
| 4,459,332 A | 7/1984 | Giglia ......................... 428/86 |
| 4,485,429 A | 11/1984 | Mittal ........................ 361/718 |
| 4,603,731 A | 8/1986 | Olsen .......................... 165/41 |
| 4,685,987 A | 8/1987 | Fick ............................ 156/247 |
| 4,849,858 A | 7/1989 | Grapes et al. ............. 361/708 |
| 4,869,954 A | 9/1989 | Squitieri |
| 5,014,161 A | 5/1991 | Lee et al. ................... 361/709 |
| 5,077,637 A | 12/1991 | Martorana et al. .......... 361/717 |
| 5,150,748 A | 9/1992 | Blackmon et al. ............ 165/41 |
| 5,178,924 A | 1/1993 | Johnson et al. |
| 5,213,868 A | 5/1993 | Liberty et al. |
| 5,328,087 A | 7/1994 | Nelson et al. |
| 5,402,006 A | 3/1995 | O'Donley .................... 257/796 |
| 5,455,458 A | 10/1995 | Quon et al. ................. 257/714 |
| 5,528,456 A | 6/1996 | Takahashi |
| 5,542,471 A | 8/1996 | Dickinson ................... 165/170 |
| 5,545,473 A | 8/1996 | Ameen et al. |
| 5,585,671 A | * 12/1996 | Nagesh et al. .............. 257/697 |
| 5,674,585 A | 10/1997 | Ewing, Jr. et al. ............ 428/96 |
| 5,691,022 A | 11/1997 | Knauf |
| 5,695,847 A | * 12/1997 | Browne ...................... 428/112 |

(List continued on next page.)

FOREIGN PATENT DOCUMENTS

| | | |
|---|---|---|
| WO | WO9 728044 | 8/1997 |
| WO | WO 98/40431 | 9/1998 |
| WO | WO99/67811 | 12/1999 |
| WO | WO 00/20525 | 4/2000 |
| WO | WO00/33628 | 6/2000 |

OTHER PUBLICATIONS

U.S. patent application Ser. No. 09/333,564, Dean, filed Jun. 1999.

S. Bolgen, "Flocking Technology", Journal of Coated Fabric, vol. 21, Oct. 1991, pp. 123–131.

(List continued on next page.)

Primary Examiner—Amir Zarabian
Assistant Examiner—Jeff Vockrodt
(74) Attorney, Agent, or Firm—Wells St. John P.S.

(57) ABSTRACT

Described is an electronic device having a compliant fibrous interface. The interface comprises a free fiber tip structure having flocked thermally conductive fibers embedded in an adhesive in substantially vertical orientation with portions of the fibers extending out of the adhesive and an encapsulant between the portions of the fibers that extend out of the adhesive and the fiber's free tips.

21 Claims, 1 Drawing Sheet

U.S. PATENT DOCUMENTS

| | | |
|---|---|---|
| 5,725,707 A | 3/1998 | Koon et al. |
| 5,726,495 A | 3/1998 | Aihara et al. ............... 257/722 |
| 5,852,548 A | 12/1998 | Koon et al. .................. 361/704 |
| 5,858,537 A | 1/1999 | Brown et al. ............... 428/408 |
| 5,873,973 A | 2/1999 | Koon et al. ............. 156/272.4 |
| 5,898,570 A | 4/1999 | Koon et al. |
| 5,904,796 A | 5/1999 | Freuler et al. |
| 5,912,805 A | 6/1999 | Freuler et al. |
| 5,968,606 A | 10/1999 | Osuna et al. |
| 6,030,856 A * | 2/2000 | DiStefano et al. .......... 438/117 |
| 6,054,198 A | 4/2000 | Bunyan et al. |
| 6,080,605 A | 6/2000 | Distefano et al. |
| 6,084,775 A | 7/2000 | Bartley et al. |
| 6,090,484 A * | 7/2000 | Bergerson ............. 428/355 EN |
| 6,096,414 A | 8/2000 | Young |
| 6,197,859 B1 | 3/2001 | Green et al. |
| 6,204,455 B1 | 3/2001 | Gilleo et al. |
| 6,311,769 B1 | 11/2001 | Bonneville et al. |
| 6,436,506 B1 | 8/2002 | Pinter et al. |

OTHER PUBLICATIONS

M. Shigematsu et al., "Application of Electrostaic Flocking to Thermal Control Coating", pp. 538–586.

A. Kato Et al., "Formation of a Very Low–Reflectance Surface by Electrostatic Flocking", 4th European Symposium on Space Environmental and Control Systems, Florence, Italy, Oct. 21–24, 1991, pp. 565–568.

* cited by examiner

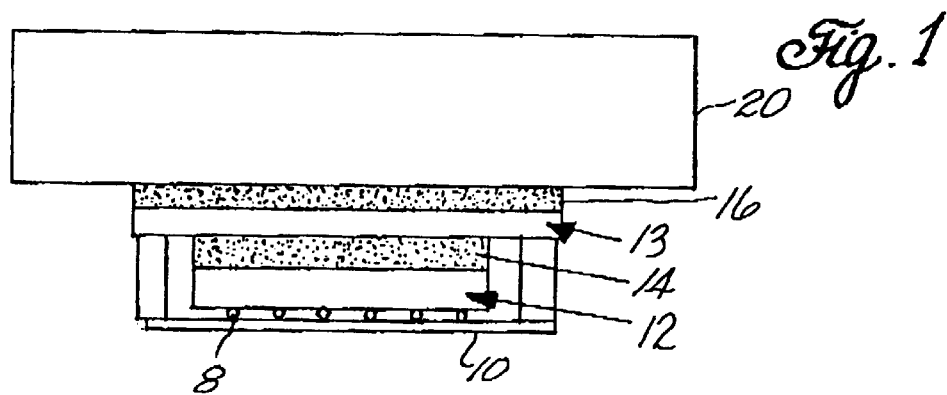
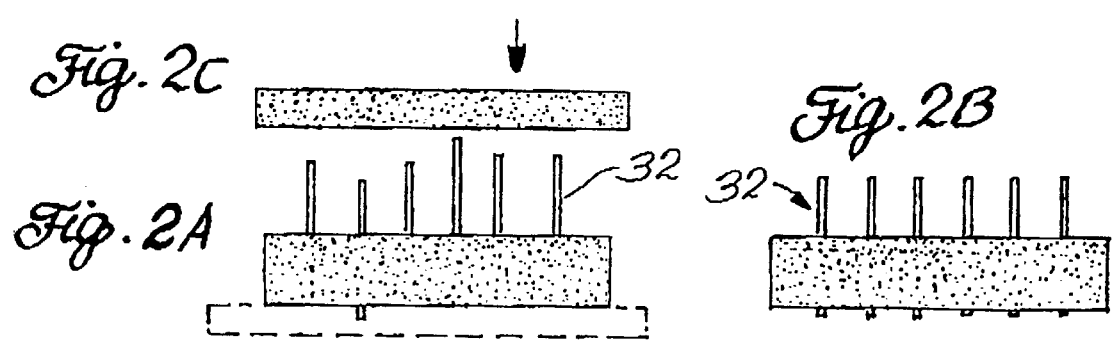
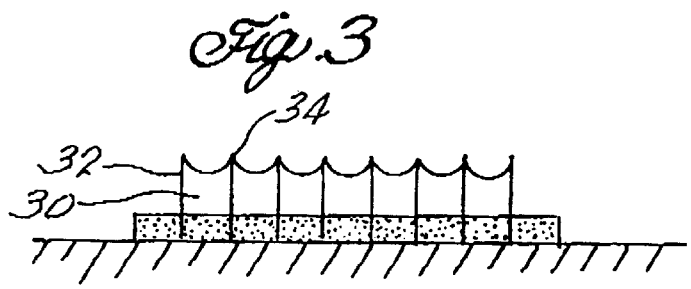

ELECTRONIC DEVICE HAVING FIBROUS INTERFACE

RELATED PATENT DATA

This patent resulted from a continuation application of U.S. patent application Ser. No. 09/103,415, filed on Jun. 24, 1998 now abandoned.

BACKGROUND OF THE INVENTION

As electronic devices become smaller and operate at higher speeds, energy emitted in the form of heat increases dramatically. A popular practice in the industry is to use thermal grease, or grease-like materials, alone or on a carrier in such devices to transfer the excess heat dissipated across physical interfaces. However, the performance of these materials breaks down, e.g. deteriorates, when large deviations from surface planarity cause gaps to form between the mating surfaces in the semiconductor device or when large gaps between mating surfaces are present for other reasons, such as variation in package heights, manufacturing tolerances, etc. When the heat transfer ability of these materials breaks down, the performance of the device is adversely affected. The present invention provides semiconductor assemblies with fibrous interfaces that deal effectively with excess heat that may be dissipated in electronic devices.

BRIEF DESCRIPTION OF THE DRAWINGS

FIG. 1 is a schematic diagram of a semiconductor assembly, with a heat sink, and showing Level I and level II interfaces;

FIGS. 2A, 2B and 2C are schematic views showing flocked fibers in adhesive, pushed into the adhesive and resulting in more or less even fiber lengths extending from the adhesive; and FIG. 3 is a schematic showing encapsulant between fibers and the free-fiber tips;

SUMMARY OF THE INVENTION

In one aspect of the invention there is provided an electronic device, e.g. a semiconductor assembly, that comprises a substrate, e.g. thermal spreader or lid, and semiconductor die with a fibrous interface, i.e. a free fiber tip structure, between the substrate and the die. The free fiber tip structure comprises flocked, e.g. electroflocked, mechanical flocked, pneumatic flocked, etc., thermally conductive fibers embedded at one end in a substrate, e.g. an adhesive, in substantially vertical orientation with portions of the fibers extending out of the adhesive. An encapsulant is disposed between the portions of the fibers that extend out of the adhesive. Disposing encapsulant material between the fibers minimizes or precludes fibers escaping the interface structure.

In other embodiments of the invention, an electronic device comprises a semiconductor assembly, e.g. a semiconductor assembly comprises a semiconductor package having a lid, e.g. a thermal lid or spreader, a semiconductor die disposed in the package and an interface comprising a free fiber tip structure between the semiconductor die and the lid of the package. The assembly may further comprise a heat sink and an interface between the lid of the package and the heat sink. In both cases, the interface comprises flocked thermally conductive fibers embedded in an adhesive, as described above.

Another aspect of the invention is a method of making an electronic device. In the method, thermally conductive fibers of desired length are provided and, if necessary, cleaned. An adhesive is applied to a substrate and the fibers at one end are flocked to a substrate so as to embed the fibers into the adhesive with a portion of the fibers extending out of the adhesive. The adhesive is then cured and space between the fibers is filled with curable encapsulant. The fibers in the adhesive with the encapsulant in the spaces between the fibers are compressed to a height less than the nominal fiber length and clamped at the compressed height. Thereafter, the encapsulant is cured while under compression to yield a free-fiber tip structure with the fiber tips extending out of the adhesive and encapsulant (alternatively, the adhesive and encapsulant may be cured concurrently, as hereafter discussed.)

DETAILED DESCRIPTION OF THE INVENTION

Semiconductor dies are generally mounted within a package and the package is interfaced with an external heat dissipating device to draw away the thermal energy. A thermal interface between the semiconductor die and the package and/or a thermal interface between the package and the heat dissipating device, are useful for removal of heat so as to maintain optimum performance of the device. The interface between the semiconductor die and the package is referred to as "Level I" packaging or interface. The connection to the external heat dissipating device, such as a heat sink, is referred to as "Level II" packaging. This arrangement is shown in FIG. 1 which illustrates a semiconductor assembly with a package 10 within which encloses a semiconductor die 12 and which includes a thermal or spreader lid 13. A Level I interface 14 is in place between the semiconductor die and the lid and a Level II interface 16 is between the lid and the heat sink 20. The semiconductor device may be attached to the package by solder 8, as shown, and the lid may comprise a thermal lid or spreader, depending upon the particular electronic device involved.

The requirement for Level I and Level II interfaces are more stringent than other system level interfaces because the heat fluxes, i.e. power or heat dissipated per unit area, are higher. Reduction in thermal performance, typically expressed by an increase in thermal resistance (° C. in$^2$/W) may be accompanied by increase in device temperature for these interfaces.

An interface material for these applications advantageously possesses a low bulk thermal resistance and a low contact resistance. A suitable material is one that conforms to the mating surfaces, e.g. wets the surfaces. The bulk thermal resistance can be expressed as a function of the material's thickness, thermal conductivity and area. The contact resistance is a measure of how well a material is able to make contact with a mating surface. This thermal resistance of an interface can be written as follows:

$$\ominus\text{interface} = \frac{t}{kA} + 2\ominus_{contact}$$

where
  θ is thermal resistance
  t is material thickness
  k is thermal conductivity of material
  A is area of interface The term $$\frac{t}{kA}$$

represents the thermal resistance of the bulk material and $2\theta_{contact}$ reflects thermal contact resistance at the two surfaces.

A good interface material should have low bulk resistance and low contact resistance, i.e. at the semiconductor die, thermal spreader, lid or heat sink surface.

Packages with Level I and Level II interfaces require that the interface material accommodate deviations from surface flatness resulting from manufacturing, and/or warpage of components due to coefficient of thermal expansion (CTE) mismatches.

In a Level I application, variation in the height of a cavity on a thermal lid leads to variation in interface thickness. A material with a low value for k, such as a thermal grease, would perform well if the interface is thin, i.e. t is low. If the interface thickness increases by as little as 0.002 inches, the thermal performance can drop dramatically. Also, for such applications, the difference in CTE between the semiconductor die, i.e. a silicon chip, and the thermal lid causes this gap to expand and contract with each temperature or power cycle. This variation of the interface thickness can cause pumping of fluid interface materials (such as grease) away from the interface.

Level II interfaces typically have a larger area and thus are more prone to deviations from surface planarity as manufactured. To optimize thermal performance, the interface material must be able to conform to non-planar surfaces and thereby lower contact resistance.

Optimal interface materials possess a high thermal conductivity and a high mechanical compliance, e.g. will yield elastically when force is applied. High thermal conductivity reduces the first term of Equation 1 while high mechanical compliance reduces the second term. An aligned thermally conductive fibrous material can accomplish both of these goals. Properly oriented, the thermally conductive fibers will span the distance between the mating surfaces thereby allowing a continuous high conductivity path from one surface to the other. If the fiber is flexible enough and able to move in its tip region, better contact can be made with the surface. This will result in an excellent degree of surface contact and will minimize the contact resistance of the interface material. A properly formed interface can be incorporated into one or more packaging components to form a thermal interface in Level I and/or Level II applications.

A semiconductor package may be constructed such that the interface material is applied to the cavity of the thermal lid between the lid and the semiconductor die. The lid can be installed upon the semiconductor package so that the interface material makes contact with and is slightly compressed by the semiconductor die. In this arrangement, the lid is held in place while an adhesive between the lid and package is cured. The interface material is then able to accommodate variations in cavity height from part-to-part and changes in distance between the semiconductor die and the lid surface during thermal cycling.

To distribute or allow external heat dissipation, an interface material can be applied between the lid and an external heat dissipating device such as a heat sink. The interface material then accommodates manufacturing induced deviations from planarity from both the package and heat dissipating surface component. The interface material may be applied to either the heat dissipating surface, e.g. heat sink, heat pipe, heat plate, thermoelectric cooler, etc. or to the package surface. The heat dissipating device may be attached to the package through the use of spring clips, bolts, or adhesive, etc. in any conventional manner.

The interface material may be made as follows:

Suitable thermally conductive fibers such as diamond fibers, carbon fibers, graphite fibers, metal fibers, e.g. copper fibers and aluminum fibers, are cut to length, e.g. from about 0.0005 to 0.25 inches, preferably about 0.015 to about 0.250 inches, and having a diameter greater than about 3 microns up to 100 microns. Presently, fibers of about 10 microns diameter are preferred. Desirable fibers have a thermal conductivity greater than about 25 W/mK. Fibers of the type that are useful include those available Amoco identified as K-1100, K-800, P-120, P-100, P-70 and T50; as well as fibers available from Toray designated M46J and M46JB.

The fibers are cleaned, if necessary. Cleaning the fibers tends to remove any coatings present on the fibers. Some commercially available fibers are sold with a coating applied to the surface which is preferably removed by cleaning. One method of cleaning is by heating the fibers in air to burn off the coating, i.e. sizing. However, chemical cleaning methods can be also used.

To produce an interface, first adhesive is applied to a substrate. Advantageously, the adhesive is a low stress adhesive, for example, an adhesive comprising epoxy (e.g. Eccobond 281 from Grace Specialty Polymers) although cyanate ester adhesive, BMI, silicones, organosilicones, gels and spray gasket materials are also useful.

The fibers are flocked to the substrate, thereby embedding the fibers in the adhesive, as shown in FIG. 2A, for example by electroflocking. Electroflocking is a well known procedure whereby two plates, separated some distance, are charged to opposite polarity. The procedure is described generically by Bolgen (Bolgen Stig W., "Flocking Technology", Journal of Coated Fabrics, Volume 21, page 123, 1991) and specifically for electroflocking of carbon Fibers by Shigematsu in "Application of Electrostatic Flocking to Thermal Control Coating", Proceedings of the 14th International Symposium on Space Technology and Science, 1984, page 583; and by Kato in "Formation of a Very Low-reflectance Surface by Electrostatic Flocking", Proceedings of the 4th European Symposium on Space Environmental and Control Systems, 1991, page 565. The disclosure of these articles is expressly incorporated herein by reference.

In the electroflocking process, fibers on one plate pick up that plate's charge and become attracted to the opposite plate. They embed in the adhesive when they hit the opposite plate. If they do not stick initially, fibers bounce back and forth between plates until they become embedded in the adhesive or escape the electric field or the charge on the plates is removed. The fiber structure that results is aligned with respect to the electric field lines, i.e. has a substantially vertical orientation, and has a velvet-like appearance.

Mechanical flocking involves passing an adhesive coated object over a series of rapidly rotating rollers or beater bars, which cause the substrate to vibrate. Fibers are fed onto the substrate by gravity from a hopper. The vibrations produced by the rollers or beater bars orient the fibers and drive them into the adhesive. Excess fiber is removed, leaving a fiber structure with substantially vertical orientation.

Pneumatic flocking uses an airstream to deliver fibers to an adhesive coated surface. While in flight, fibers align themselves in the direction of the airflow and embed in the adhesive in an oriented manner.

Different flocking methods may be used alone, or in conjunction with one another, e.g., pneumatic/electrostatic flocking. With this combination method, an airstream containing fibers is directed through a nozzle. At the exit of the nozzle, a charge orients the fibers with respect to electric field lines. The fiber structure that results is also aligned, i.e., has substantial vertical orientation, but may be denser, more uniform or produced more rapidly than when either method is used alone.

The flocked fibers are seated into the adhesive with a portion of their lengths extending from the adhesive layer, referred to as "free fiber tips". After flocking, a downward force is applied to the free fiber tips to seat the fibers in the adhesive and minimize the distance between the fiber tips embedded in the adhesive and the surface substrate to which the adhesive is applied, as shown in FIGS. 2B and 2C.

The adhesive is then cured, e.g. by self-curing or application of heat. Oftentimes heating for about 30 minutes at about 175° C. may be used for curing, depending on the adhesive and curing conditions.

As shown in FIG. 3, an encapsulant, 30, for example a gel such as GE RTV6166 dielectric gel available from General Electric Corporation is introduced to fill space between fibers 32 leaving free fiber tips 34 extending from the gel. This can be done by stenciling uncured gel onto the fibers or applying the gel to the fibers and letting the gel soak or wick in. It is advantageous to use a gel that spontaneously wets the fibers and will wick into the fiber structure. The gel may or may not include a thermally conductive filler material. A release liner, i.e. waxy or silicone coated paper may be placed on top of the fibers and uncured gel to prevent the cured gel/fiber material from sticking to a clamping fixture and provides protection to the interface material during shipping or subsequent handling.

The interface with uncured gel between the fibers is compressed to less than the nominal cut fiber length and clamped in place to this compressed height. For example, if the fiber is about 0.02 inches long, adhesive cured gel is introduced then clamped to a height of about 0.017 inches before curing the gel which holds the fiber at this height while the gel is cured.

The gel is then cured, e.g. thermally cured, while under compression. Heating generally accelerates curing and is desirable to create a beneficial free-fiber tip structure. Both the compression and thermal cure aid in creating the free-fiber tip structure. The thermal cure is beneficial since the CTE of the gel is higher than that of the fibers and the gel will shrink more than the fibers upon cooling to room temperature, thereby exposing more fiber tips.

In producing the interface material, the adhesive curing may be delayed to coincide with the curing of the gel. In this case, the fibers are seated at the same time as the gel and the adhesive are cured. As indicated, compression is beneficial, and curing under compression is beneficial, because the gel will maintain the cured thickness and the fibers can spring back somewhat to stick up from the gel. Cohesion of the gel to the fibers is not strong enough to keep the fibers from assuming their original position prior to curing. This results in the free fiber tips which are desirable for enhanced thermal contact with the adjacent surface(s) and Level I and Level II applications.

It is apparent from the foregoing that various changes and modifications may be made without departing from the invention. Accordingly, the scope of the invention should be limited only by the appended claims, wherein:

What is claimed is:

1. A method of making a semiconductor assembly by:
   combining an encapsulant with a plurality of thermally conductive fibers, individual fibers having a length and two ends and the encapsulant having a thickness;
   encapsulating a portion of the individual lengths of the plurality of fibers, an average distance between the ends of the individual encapsulated fibers being greater than an average thickness of the encapsulant along the fiber lengths of the plurality of fibers; and
   forming a thermally conductive composite from the encapsulant and the fibers;
   wherein the improvement comprises:
      interposing the thermally conductive composite between a semiconductor die and a substrate.

2. The method of claim 1 wherein the improvement further comprises:
   applying a release liner over the encapsulant and fibers; and
   removing the release liner before the interposing.

3. A method of making a semiconductor assembly by:
   combining an encapsulant with a plurality of thermally conductive fibers, individual fibers having a length and two ends and the encapsulant having a thickness;
   encapsulating a portion of the individual lengths of the plurality of fibers, an average distance between the ends of the individual encapsulated fibers being greater than an average thickness of the encapsulant along the fiber lengths of the plurality of fibers; and
   forming thermally conductive composite material from the encapsulant and the fibers;
   wherein the improvement comprises:
      providing a semiconductor package having a lid, a semiconductor die disposed in the package, and a heat sink; and
      interposing thermally conductive composite material between the lid and the heat sink.

4. The method of claim 3 wherein the improvement further comprises:
   applying a release liner over the encapsulant and fibers; and
   removing the release liner before the interposing.

5. The method of claim 3 wherein the improvement further comprises interposing thermally conductive composite material between the semiconductor die and the lid.

6. A method of making a semiconductor assembly by:
   combining a gel encapsulant with a plurality of thermally conductive fibers, individual fibers having a length;
   encapsulating at least a portion of the individual lengths of the plurality of fibers; and
   forming a thermally conductive composite from the encapsulant and the fibers;
   wherein the improvement comprises:
      interposing the thermally conductive composite between a semiconductor die and a substrate.

7. The method of claim 6 wherein the improvement further comprises:
   applying a release liner over the encapsulant and fibers; and
   removing the release liner before the interposing.

8. A method of making a semiconductor assembly by:
   combining a gel encapsulant with a plurality of thermally conductive fibers, individual fibers having a length;
   encapsulating at least a portion of the individual lengths of the plurality of fibers; and
   forming thermally conductive composite material from the encapsulant and the fibers;
   wherein the improvement comprises:

providing a semiconductor package having a lid, a semiconductor die disposed in the package, and a heat sink; and interposing thermally conductive composite material between the lid and the heat sink.

9. The method of claim 8 wherein the improvement further comprises:

applying a release liner over the encapsulant and fibers; and removing the release liner before the interposing.

10. The method of claim 8 wherein the improvement further comprises interposing thermally conductive composite material between the semiconductor die and the lid.

11. A method of making a semiconductor assembly by:

embedding a plurality of thermally conductive fibers in a support material, the support material having a first surface and a second opposing surface and the fibers having first portions that extend upwardly out of the second opposing surface of the support material;

applying an encapsulant between the first portions of the fibers and over the support material, the support material, encapsulant, and fibers forming a thermally conductive composite; and forming a third surface defining an outermost surface of the thermally conductive composite except for the fiber first portions terminating in tips that are elevationally above the third surface and the encapsulant;

wherein the improvement comprises:

applying the first surface to one of a semiconductor die or a lid; and applying the fiber tips elevationally above the third surface to the other of the semiconductor die or the lid.

12. The method of claim 11 wherein the improvement further comprises:

applying a release liner over the encapsulant and fibers; and removing the release liner before the interposing.

13. The method of claim 11 wherein the improvement further comprises seating the fibers in the support material, the fibers having second portions that extend downwardly to at or below the first surface of the support material.

14. The method of claim 11 wherein the improvement further comprises also applying the third surface to the other of the semiconductor die or the lid.

15. A method of making a semiconductor assembly by:

embedding a plurality of thermally conductive fibers in a support material, the support material having a first surface and a second opposing surface and the fibers having first portions that extend upwardly out of the second opposing surface of the support material;

applying an encapsulant between the first portions of the fibers and over the support material, the support material, encapsulant, and fibers forming a thermally conductive composite material; and forming a third surface defining an outermost surface of the thermally conductive composite material except for the fiber first portions terminating in tips that are elevationally above the third surface and the encapsulant;

wherein the improvement comprises:

providing a semiconductor package having a lid, a semiconductor die disposed in the package, and a heat sink; and interposing thermally conductive composite material between the lid and the heat sink.

16. The method of claim 15 wherein the improvement further comprises:

applying a release liner over the encapsulant and fibers; and removing the release liner before the interposing.

17. The method of claim 15 wherein the improvement further comprises interposing thermally conductive composite material between the semiconductor die and the lid.

18. The method of claim 15 wherein the improvement further comprises seating the fibers in the support material, the fibers having second portions that extend downwardly to at or below the first surface of the support material.

19. The method of claim 15 wherein the improvement further comprises applying the fiber tips elevationally above the third surface to one of the lid or the heat sink.

20. A method of making a semiconductor assembly by:

combining an encapsulant with a plurality of straight, thermally conductive fibers, individual fibers having a length and the encapsulant having a thickness;

encapsulating a portion of the individual lengths of the plurality of fibers, an average length of the straight, encapsulated fibers being greater than an average thickness of the encapsulant along the fiber lengths of the plurality of fibers; and forming a thermally conductive composite from the encapsulant and the fibers;

wherein the improvement comprises:

interposing the thermally conductive composite between a semiconductor die and a substrate.

21. A method of making a semiconductor assembly by:

combining an encapsulant with a plurality of straight, thermally conductive fibers, individual fibers having a length and the encapsulant having a thickness;

encapsulating a portion of the individual lengths of the plurality of fibers, an average length of the straight, encapsulated fibers being greater than an average thickness of the encapsulant along the fiber lengths of the plurality of fibers; and forming thermally conductive composite material from the encapsulant and the fibers;

wherein the improvement comprises:

providing a semiconductor package having a lid, a semiconductor die disposed in the package, and a heat sink; and interposing thermally conductive composite material between the lid and the heat sink.

* * * * *